United States Patent
Chaudhry et al.

(10) Patent No.: US 6,576,521 B1
(45) Date of Patent: *Jun. 10, 2003

(54) METHOD OF FORMING SEMICONDUCTOR DEVICE WITH LDD STRUCTURE

(75) Inventors: Samir Chaudhry, Orlando, FL (US); Sundar S. Chetlur, Orlando, FL (US); Hem M. Vaidya, Orlando, FL (US)

(73) Assignee: Agere Systems Inc., Allentown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,555

(22) Filed: Apr. 7, 1998

(51) Int. Cl.[7] ............................................. H01L 21/336

(52) U.S. Cl. ........................ 438/303; 438/306; 438/307; 438/595

(58) Field of Search ................................ 438/257, 262, 438/263, 264, 266, 301, 303, 197, 305, 306, 307, 369, 299, 371, 372, 373, 374, 375, 521, 527, 529, 546, 547, 548, 784

(56) References Cited

U.S. PATENT DOCUMENTS

| 4,629,520 A | * | 12/1986 | Ueno et al. .................. 438/529 |
| 4,851,360 A | * | 7/1989 | Haken et al. ................ 438/529 |
| 4,935,379 A | * | 6/1990 | Toyoshima ................... 438/305 |
| 5,019,527 A | * | 5/1991 | Ohshima et al. ............. 438/257 |
| 5,073,509 A | * | 12/1991 | Lee ............................. 438/529 |
| 5,334,870 A | * | 8/1994 | Katada et al. ............... 257/371 |
| 5,358,908 A | * | 10/1994 | Reinberg et al. ............ 438/546 |
| 5,641,696 A | * | 6/1997 | Takeuchi ..................... 438/305 |
| 5,719,424 A | * | 2/1998 | Ahmad et al. ............... 438/307 |
| 5,723,352 A | * | 3/1998 | Shih et al. ................... 438/307 |
| 5,917,218 A | * | 6/1999 | Choi et al. ................... 257/345 |
| 6,071,775 A | * | 6/2000 | Choi et al. ................... 438/257 |
| 6,078,079 A | * | 6/2000 | Ogoh .......................... 257/344 |

FOREIGN PATENT DOCUMENTS

| JP | 7-38101 | * | 2/1995 |
| JP | 11-168221 | * | 6/1999 |

* cited by examiner

Primary Examiner—Olik Chaudhuri
Assistant Examiner—Jack Chen

(57) ABSTRACT

A NMOSFET semiconductor device is formed having an LDD structure by simultaneous co-implantation of arsenic and phosphorous to form an N– layer. The co-implantation is performed subsequent to the formation of the gate structure and a thin (100 Å–300 Å) gate spacer but prior to the implantation of a highly doped N+ source/drain.

15 Claims, 6 Drawing Sheets

METHOD OF FORMING SEMICONDUCTOR DEVICE WITH LDD STRUCTURE

FIELD OF THE INVENTION

This invention relates to semiconductor integrated circuit fabrication and, more particularly, to an improved process for fabricating MOS devices having lightly doped drain (LDD) and source regions.

BACKGROUND OF THE INVENTION

Semiconductor integrated circuits are comprised of a plurality of devices which invariably include transistors. Transistors are of two general types, namely bipolar and field effect transistors (FET'S).

FIG. 1 describes a common type N-channel MOSFET structure which is a part of a silicon integrated circuit. This MOSFET comprises a semiconductor substrate 1 such as single crystal or epitaxially grown silicon having a region which has been doped to form a P-well 2. An active area 3 is defined between spaced field oxide regions 4 and 5. A gate region 6 of a conductive material such as polysilicon is separated from the surface of the phosphorous doped substrate by a layer 7 of dielectric material such as silicon dioxide. A conductive interconnect material 8 such as tungsten silicide is formed above and in contact with the gate region 6 for interconnecting the gate to other circuit devices. Implanted into the p-doped region 2 are source 9 and drain 10 regions, commonly formed by ion implanting or diffusing a n-type dopant such as arsenic (As) or phosphorus (P), with the FET channel 11 formed therebetween. A cap layer 12 and sidewall spacer 13 structures of insulating material such as silicon nitride protect the gate structures during processing.

Semiconductor processing techniques as described above as well as variations of the structure described above are well known in the art and can be found in many references. By way of example, reference may be had to *Silicon Processing For the VLSI Era*, Lattice Press 1990; U.S. Pat. No. 5,573,965 to Chen et al, U.S. Pat. No. 5,679,589 to Lee et al, U.S. Pat. No. 5,721,443 to Zhiqiang, U.S. Pat. No. 5,719,424 to Ahmad et al and U.S. Pat. No. 5,723,352 to Shih et al, all of which are incorporated herein by reference.

With the continuously increasing demand for further miniaturization and device speed, MOSFETS have been scaled to the point where the channel length from source to drain falls below 0.5 micron. As the channel shrinks the electric field in the channel region increases resulting in higher substrate current and short/long term hot electron reliability problems primarily due to a tendency to become trapped in the gate dielectric region. One method which has been employed to partially overcome these problems and increase device reliability and performance of NMOSFETS involves adding a LDD region between the FET channel region 11 and each of the source 9 and drain 10 region. In the past, this has been accomplished by either the implantation of a low dosage of phosphorous to the source 9 region and the drain 10 region to form N− regions therein (FIG. 2). Due to the relatively high diffusivity of phosphorous, the N− regions formed by phosphorous implantation extend underneath the spacers 13 toward the FET channel area 11 under the gate structure. Subsequently, as shown in FIG. 3, a high dosage As implant creates N+ source 16 and drain 17 regions which supersede most of the lightly doped N− regions leaving lightly doped regions 18 and 19 separating the source and drain from the channel. This is what has been called the LDD structure.

However, as devices get still smaller and FET channels are less than 0.4 microns, limitations on fabrication precision result in structures which are far from ideal. Due to the high diffusivity, the phosphorous in the N− regions further diffuses into the channel during the subsequent high heat drive process used to create the N− source and drain regions. This causes severe short channel problems, results in increased sub-threshold leakage and generally adversely affects device performance and reliability.

An alternative to the phosphorous LDD is to use arsenic to create the LDD structures as proposed by H. R. Grinolds, et al in *Reliability and Performance of Submicron LDD NMOSFET's with buried As n-Impurity Profiles*, IEDM Tech Dig., 1985, pp. 246–249 and by C. Y. Wei, et al in *Buried and Graded/Buried LDD Structures for Improved Hot Electron Reliability*, IEEE Electron Device Lett., vol. EDL-7, pp 6, June 1986. Here, a low dosage As implant is formed prior to formation of the spacer and the N+ implant is performed subsequent to formation of the spacer. While the low diffusivity of arsenic as compared with phosphorous generally results in a more predictable structure which does not suffer the same short channel problems of phosphorous LDD structures, the abrupt ends of the N− region below the edges of the gate region creates a maximum electric field (E-field) which is still unsuitable for high performance and high reliability devices due to a hot electron problem. To alleviate this problem, a combination P/As LDD structure has been described where a phosphorous-LDD implant is performed followed by an As-LDD implant. Again, due to the diffusivity of the phosphorous, during subsequent processing the short channel characteristics are degraded. Ahmad et al, in U.S. Pat. No. 5,719,424 describe an alternative process utilizing a low dose arsenic implant to form an N− region prior to formation of the gate spacer, followed by the formation of the spacer and then the high temperature high dose N+ arsenic implant. Thereafter, a low dose phosphorous implantation step is employed. This minimizes unwanted phosphorous diffusion which normally takes place when the phosphorous is implanted prior to the N+ arsenic layer. In U.S. Pat. No. 5,723,352 still another combined As/P LDD structure is taught. There, the LDD regions are formed by first ion implanting phosphorous, followed by a blanket ion implantation of arsenic between a FOX region and polysilicon gate region. The device is the annealed to crystallize the metal silicide layer on the polysilicon gate. This is followed by the creation of an insulating spacer on the sidewalls of the gate and then a heavily doped blanket arsenic ion implantation to form N+ source and drain regions with subsequent heat treatment resulting in the overlap of the N+ regions and the LDD regions.

It would therefor be desirable to have a process which produces a sub-half micron MOSFET without improved performance and/or reliability in an efficient and economical manner.

SUMMARY OF THE INVENTION

In accordance with the present invention a NMOSFET having a LDD structure is formed on an integrated circuit chip by simultaneously co-implanting low doses of both arsenic and phosphorous in the region of the substrate between the field oxide and a thin LDD spacer on the polysilicon gate prior to the formation of the conventional and relatively thick gate spacer, and prior to N+As implantation.

By co-implanting the arsenic and phosphorous as set forth, we have found that the E-field is reduced, the peak field is moved deeper into the silicon substrate, a broader potential minimum is obtained, hot carrier aging characteristics are improved and TED is reduced. The use of the thin LDD spacer allows conventional device Leff control to be retained. This is achieved while reducing the number of processing steps as compared to prior art LDD structures employing both low arsenic and low phosphorous dopants created in subsequent or sequential processing steps.

DETAILED DESCRIPTION OF THE INVENTION

Figure 1:
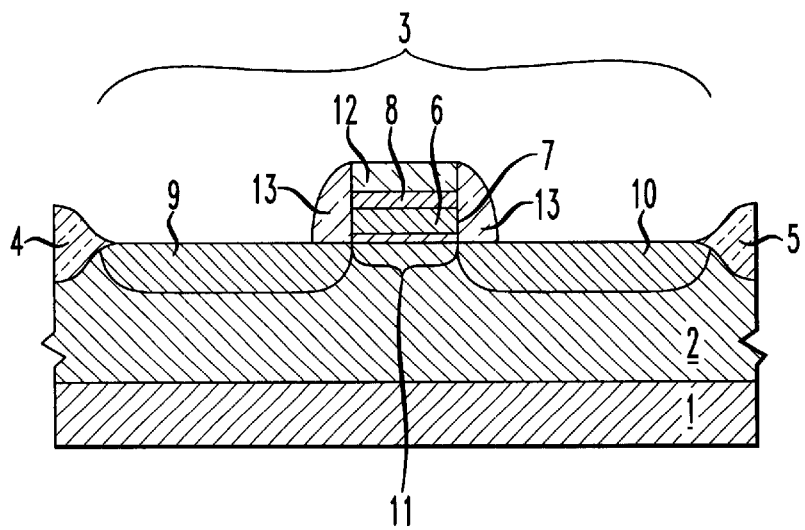
FIG. 1 is a prior art cross-sectional view of a MOSFET having non-graded source and drain electrodes.
Figure 2:
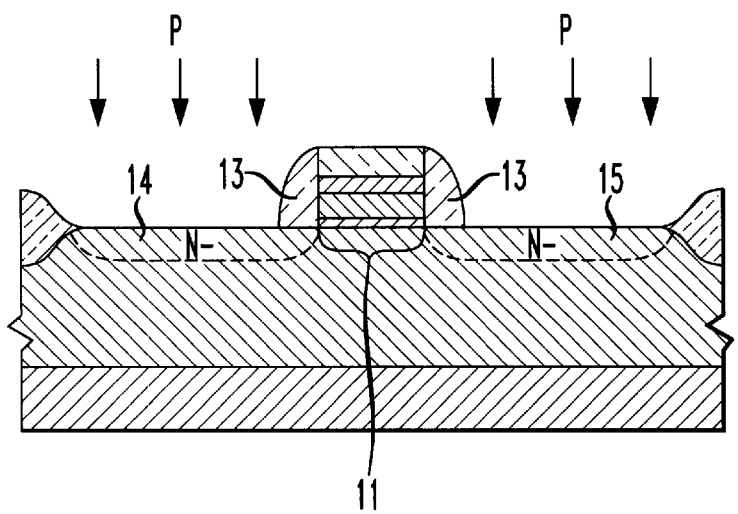
FIG. 2 is a prior art cross-sectional view of an in-process NMOSFET during a low dosage phosphorous implant of a pair of N–LDD structures.
Figure 3:
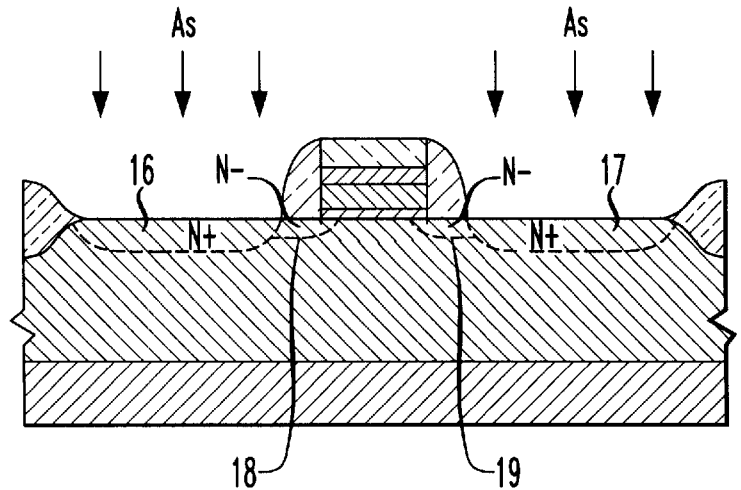
FIG. 3 is a prior art cross-sectional view of the in-process NMOSFET of FIG. 2 during a high dosage arsenic implant to create N+ source and drain regions.
Figure 4:
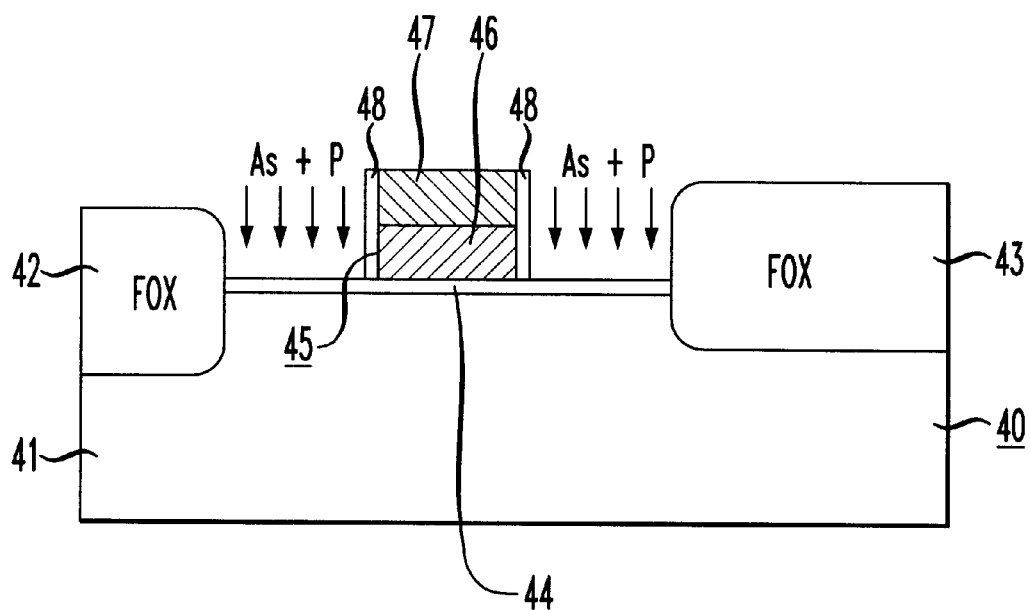
FIG. 4 is a cross-sectional view representing an in-process NMOSFET during low dosage implantation of both arsenic and phosphorous ions in accordance with the present invention.

Referring to FIG. 4, there is shown a cross-section of a MOSFET device 40 in-process. As shown, the device comprises a p-type doped silicon substrate 41 having spaced field oxide regions 42 and 43; a dielectric layer 44 disposed on the surface between field oxides 42 and 43 which layer is typically silicon oxide; a gate structure 45 over the central portion of the dielectric layer 44 and spaced from the field oxide regions 42 and 43; the gate structure comprises a polysilicon gate layer 46 and a conductive layer 47, such as tungsten disilicide disposed on the polysilicon gate 46; and an initially thin spacer structure 48 on the sidewalls of the gate structure 45. The spacer structure 48 is employed to control the channel length. During further processing subsequent to implantation of the LDD N– dopants, as shown if FIG. 9, the spacer thickness can be built up by depositing one or more additional layers 50 over the thin spacer 48. Methods for spacer formation are taught in the prior art which has been incorporated herein by reference. Typically, the thin spacer is in the order of about 100 Å–300 Å. The methods of formation of each of the above portions of the MOSFET is well known in the art.

Figure 9:
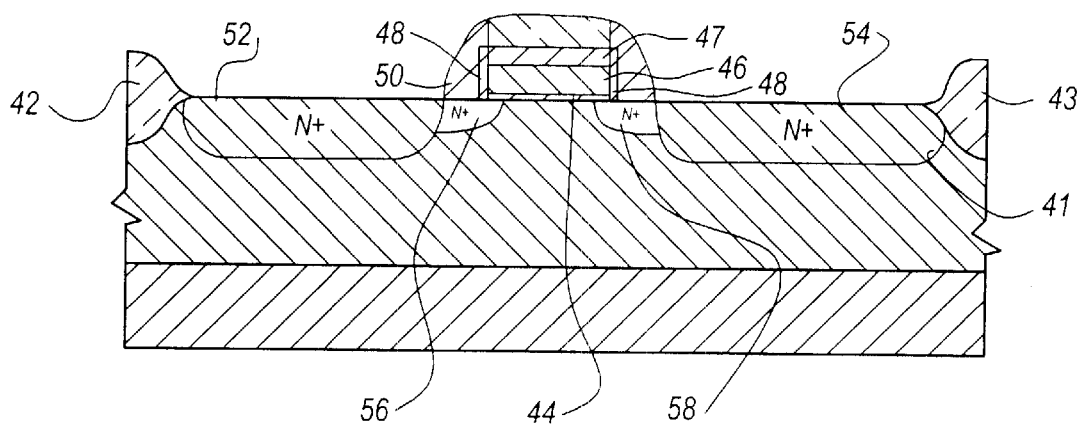
FIG. 9 is a cross-sectional view representing the NMOSFET device of the invention subsequent to processing as described with reference to claim 4 and subsequent processing.

As shown in FIG. 4 a thin oxide layer which has been deposited and etched is present on the gate structure to provide an LDD spacer. A dual simultaneous low dopant concentration implant of both arsenic and phosphorous is then accomplished so as to provide N– doping of the substrate between the field oxide regions 42 and 43 and the gate layer 46. The dose ratio of As to P is important in determining device performance. The phosphorus, because of its greater diffusivity, migrates laterally under the spacer whereas the arsenic tends not to so migrate to the same extent. Subsequent to this processing step, further processing to form the N+ source and drain regions and other usual processing steps including masking, etching, formation of electrodes, etc. proceed in any of the ways set forth in the prior art in order to complete the device. Referring to FIG. 9, one can see a depiction of the device subsequent to the formation of the thickened gate spacer 50 and implantation of the high dose arsenic and annealing to form the N+ source 52 and drain 54 regions between the field oxides 42 and 43 and the thickened gate sidewall spacer 50 and the LDD regions 56 and 58 between the source and drain regions, 52 and 54 and extending, by virtue of phosphorous diffusion, under the thin gate sidewall spacer 48.

The dual implantation is preferably carried out under the following conditions. The thin LDD spacer is preferably formed via a 200 Å–300 Å TEOS oxide deposition and etch process, immediately after gate definition. This is followed by simultaneous arsenic (120 keV; 3e13–1.08e14/cm$^2$) and phosphorous (60 keV; 1.2e13–9e13/cm$^2$) co-implantation.

Relative concentrations of As/P in the implant mixture of from 90% As+10% P to 25% As+75% P can be employed. Preferred mixtures of arsenic and phosphorous contain from about 10% P to about 50% P while the most preferred mixtures contain from 10% P to 25% P. The optimum implant conditions utilize a spacer width in the order of 200 Å. The range of phosphorous indicated as most preferred minimizes the short channel effect degradation while the E-field improvement is similar to the higher phosphorous ratios. Hence, it should be understood that our designation of the most preferred ratio is somewhat of a tradeoff and others may prefer a somewhat higher phosphorous ratio within the broader range set forth above. Dosages of phosphorous above the preferred ranges tend to cause reduced Leff control and the merging of the LDD and drain regions of the completed device. Dosages of As above the preferred range tends to minimize the improvement achievable with respect to substrate current. This is believed to be due to a significant reduction of phosphorous diffusivity at high arsenic concentrations, thereby resulting in a sharper drain profile as compared with the more graded profile. Subsequent processing is similar to conventional MOSFET production processing including conventional spacer formation, high dose N+ arsenic implantation, source/drain activation and metalization.

Figure 5:
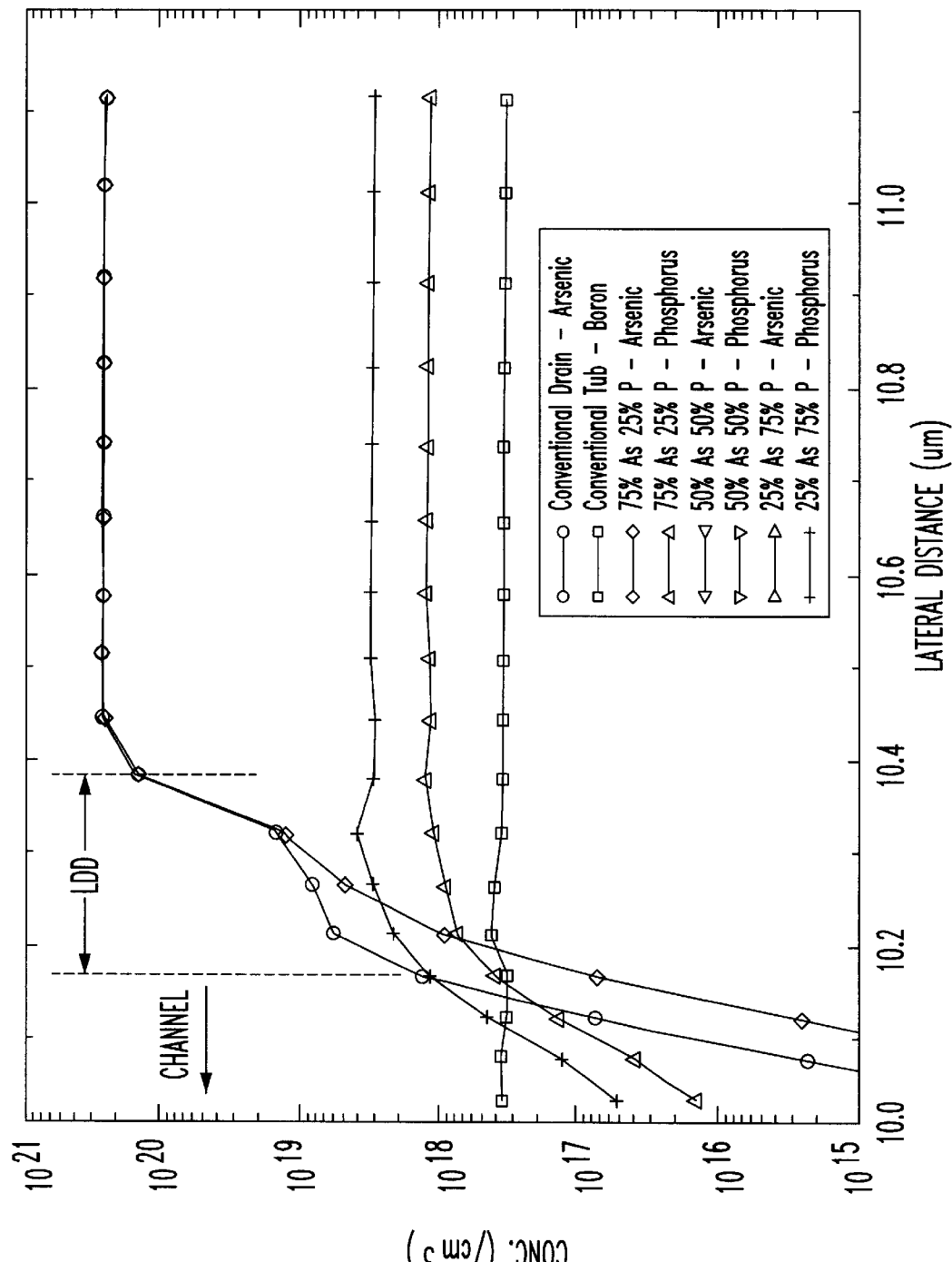
FIG. 5 are simulated plots of dopant concentration as a function of lateral distance of dopants for various dopant combination showing the graded profiles in the LDD structure.

Simulations comparing a conventional 0.35 $\mu$m-3V NMOS arsenic LDD structure to dual doped structures according to the present invention were made. Generally these simulations show a more graded dopant profile in the LDD region and reduction in the peak electric field for As/P ratios of from 3:1 to 1:3 employing the 200 Å spacer width as compared to the conventional device. The simulated doping profiles can be seen with reference to FIG. 5 wherein it can be seen that the conventional device exhibits a relatively sharp arsenic profile while the dual doped devices having both arsenic and phosphorous LDD dopants makes the net n-type doping profile more graded. The use of phosphorous doses >>50% result in significant Leff reduction. The use of phosphorous doses <<50% result in significant increase in the channel resistance.

Figure 6:
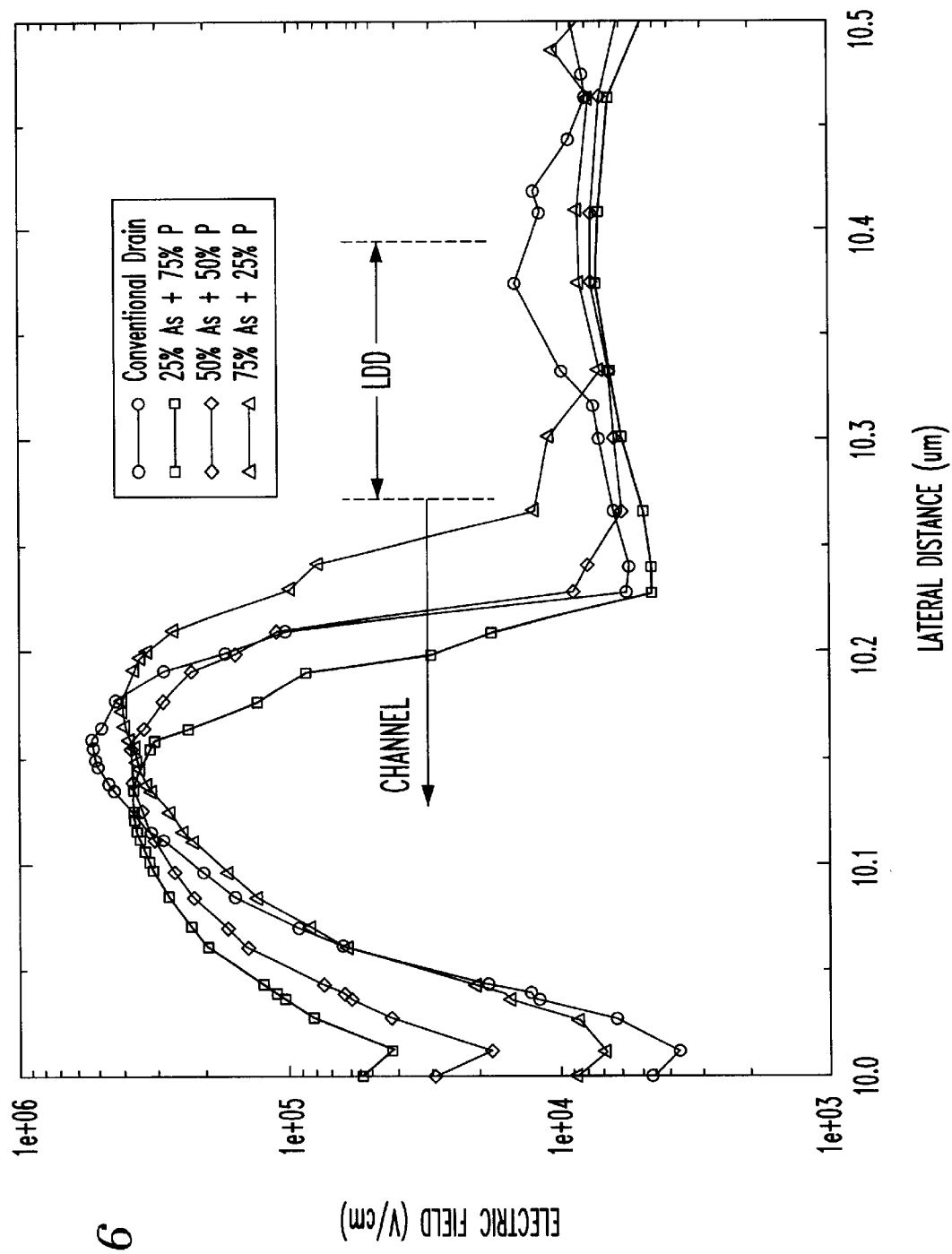
FIG. 6 are simulated semi logarithmic plots of the electric field as a function of lateral distance of the dopants illustrating the reduction of peak electric field in dual diffused LDD structures.

The simulated electric field for the dual diffused LDD structures as compared to a conventional structure is shown in FIG. 6. The peak electric field for the various LDD dopant processing is also shown in the table below wherein it can be seen that the peak electric field is reduced by about 30% for the novel dual LDD processing.

| LDD Dopant | Peak E-Field (V/cm) × $10^5$ |
|---|---|
| Conventional (As) | 5.6 |
| 75% As + 25% P | 3.9 |
| 50% As + 50% P | 3.7 |
| 25% As + 75% P | 3.6 |

Figure 7:
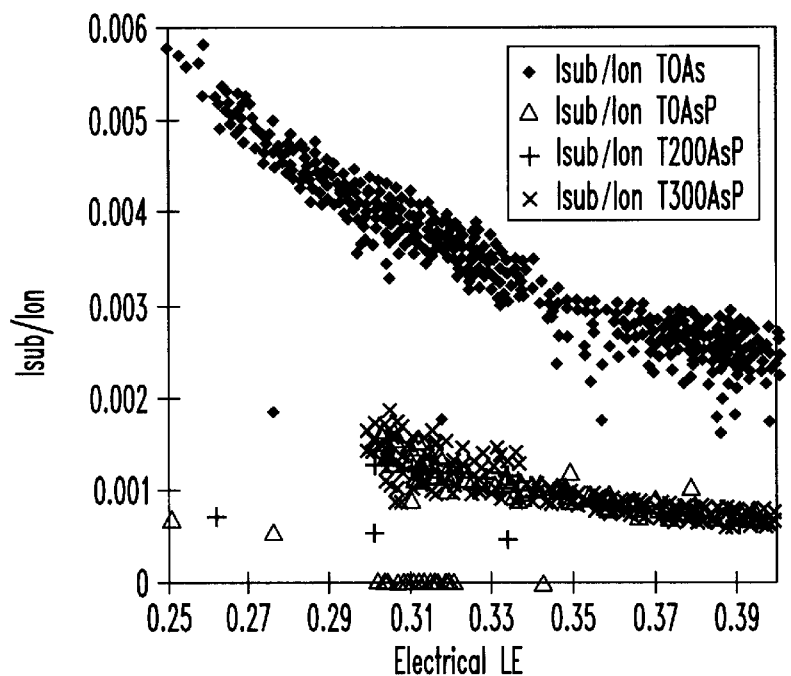
FIG. 7 is a plot of substrate current per ion normalized to maximum drive current as a function of electrical channel length showing the lowering of Isub/Ion for As+P implants compared to prior art As implants.
Figure 8:
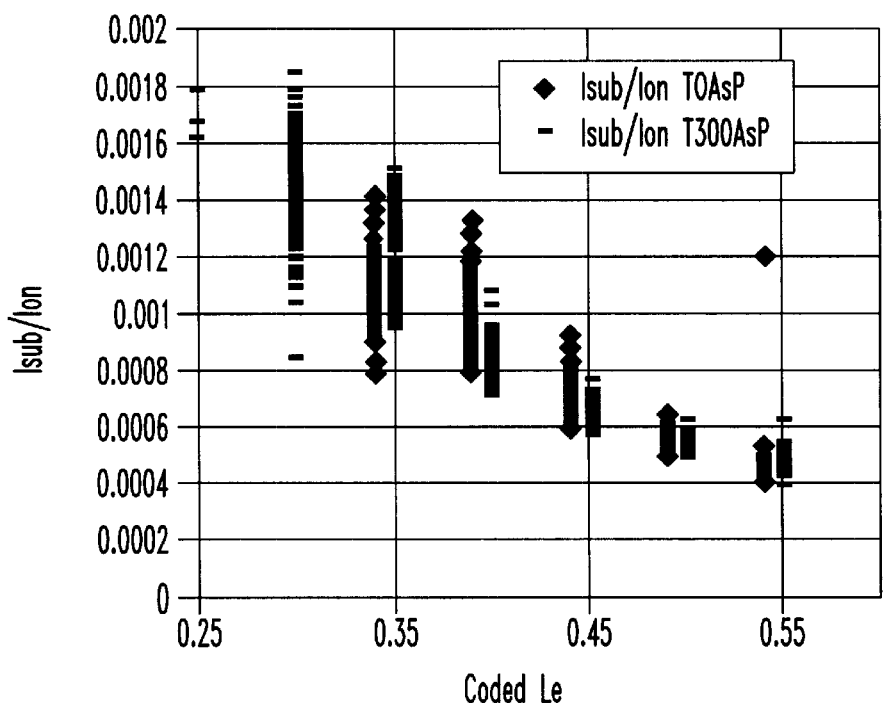
FIG. 8 is a graphical representation of the normalized substrate current as a function of coded electrical channel length for two different As+P implants.

From FIG. 7, one can clearly see that use of the As+P co-implant lowers the substrate current significantly as compared with the prior art arsenic LDD implants. The captions T0As, T0AsP, T200AsP and T300AsP refer to arsenic implantation without a spacer, co-implantation of As and P without a spacer, co-implantation of As and P with a 200 Å spacer, and co-implantation of As and P with a 300 Å spacer, respectively. FIG. 8 shows that devices with coded channel lengths as low as 0.30 microns can be fabricated which have low substrate currents when a LDD spacer is used.

What we claim is:

1. A method of fabricating, in an integrated circuit, a sub-micron channel length MOSFET device, comprising:
    simultaneously implanting about 3E13 to 1.08E14/cm$^2$ of arsenic ions and about 1.2E13 to 9E13/cm$^2$ of phosphorous ions into a semiconductor substrate to create opposing LDD regions between opposing field oxide regions and opposing inner edges of opposing sidewall gate spacers adjacent a gate structure located between the opposing field oxide regions.

2. The method recited in claim 1 wherein a thickness of each of the opposing sidewall gate spacers ranges from about 100 to 300 Angstroms.

3. The method recited in claim 2 wherein subsequent to ion implantation of the arsenic and phosphorous ions, but prior to thermal anneal, the thickness of each of the sidewall gate spacers is built up by depositing additional spacer material over the sidewall gate spacers and an arsenic ion implant at a dosage sufficient for forming N+ regions is performed by depositing arsenic in the region between the field oxide and the sidewall gate spacers having the built-up thickness, whereby upon thermal anneal the LDD regions, and source and drain regions, are simultaneously formed.

4. The method recited in claim 1 wherein subsequent to ion implantation of the arsenic and phosphorous ions, but prior to thermal anneal, the thickness of each of the sidewall gate spacers is built up by depositing additional spacer material over the sidewall gate spacers and an arsenic ion implant at a dosage sufficient for forming N+ regions is performed by depositing arsenic in the region between the field oxide and the sidewall gate spacers having the built-up thickness, whereby upon thermal anneal the LDD regions, and source and drain regions, are simultaneously formed.

5. The method recited in claim 1 further including forming the gate structure and the sidewall gate spacers prior to implanting wherein the sidewall gate spacers are from about 100 Å to about 300 Å thick.

6. The method recited in claim 5 wherein the sidewall gate spacers are in the order of 200 Å thick.

7. The method recited in claim 1 wherein implanting includes implanting a ratio of arsenic to phosphorous ranges from about 9:1 to about 1:3.

8. The method recited in claim 7 further including forming the gate structure and the sidewall gate spacers prior to implanting wherein the sidewall gate spacers are from about 100 Å to about 300 Å thick.

9. The method recited in claim 1 wherein implanting includes implanting a ratio of arsenic to phosphorous ranges from about 9:1 to about 1:1.

10. The method recited in claim 9 further including forming the gate structure and the sidewall gate spacers prior to implanting wherein the sidewall gate spacers are from about 100 Å to about 300 Å thick.

11. The method recited in claim 1 wherein implanting includes implanting a ratio of arsenic to phosphorous ranges from about 9:1 to about 3:1.

12. The method recited in claim 11 further including forming the gate structure and the sidewall gate spacers prior to implanting wherein the sidewall gate spacers are from about 100 Å to about 300 Å thick.

13. The method recited in claim 1 wherein implanting includes forming the MOSFET device having a channel length of less than about 0.5 microns.

14. The method recited in claim 13 wherein the channel length is from about 0.3 to about 0.5 microns.

15. A method of fabricating, in an integrated circuit, a sub-micron channel length MOSFET device, comprising:
    simultaneously implanting about 3E13/cm$^2$ to about 1.08E14/cm$^2$ of arsenic ions at about 120 KeV and about 1.2E13/cm$^2$ to about 9E13/cm$^2$ of phosphorous ions at about 60 KeV into a semiconductor substrate to create opposing LDD regions between opposing field oxide regions and opposing inner edges of opposing sidewall gate spacers adjacent a gate structure located between the opposing field oxide regions.

* * * * *